United States Patent
Lee et al.

(10) Patent No.: US 6,737,217 B2
(45) Date of Patent: May 18, 2004

(54) PHOTORESIST MONOMERS CONTAINING FLUORINE-SUBSTITUTED BENZYLCARBOXYLATE AND PHOTORESIST POLYMERS COMPRISING THE SAME

(75) Inventors: Geun Su Lee, Ichon (KR); Jae Chang Jung, Kyoungki-do (KR); Ki Soo Shin, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 35 days.

(21) Appl. No.: 10/107,646

(22) Filed: Mar. 27, 2002

(65) Prior Publication Data
US 2003/0022103 A1 Jan. 30, 2003

(30) Foreign Application Priority Data
Jun. 21, 2001 (KR) ......................... 2001-35469

(51) Int. Cl.$^7$ ............................. G03F 7/004
(52) U.S. Cl. ................ 430/270.1; 430/325; 430/326; 526/242
(58) Field of Search ................ 430/270.1, 326, 430/907; 526/242

(56) References Cited

U.S. PATENT DOCUMENTS

| | | | | |
|---|---|---|---|---|
| 4,822,721 A | * | 4/1989 | Tsutsumi et al. | 430/325 |
| 5,356,557 A | * | 10/1994 | Jubb et al. | 252/299.01 |
| 5,684,059 A | * | 11/1997 | Salamone | 523/107 |

OTHER PUBLICATIONS

Diaz–Calleja et al., Chemical Abstract DN 133:238614.*
Suyal et al, US 2003/0114619 A1, Jun. 2003.*
Gupta et al., Polymer 1993, 34(19) 4173–4175.*
Athawale et al., Journal Molecular Science, Pure Applied Chemistry 1998 A35(6) 985–1001.*
Guo et all, Journal of Polymer Science, Part A 1994 32(1) 47–56.*

* cited by examiner

Primary Examiner—Rosemary Ashton
(74) Attorney, Agent, or Firm—Marshall, Gerstein & Borun LLP (57) ABSTRACT

Photoresist monomers, photoresist polymers prepared therefrom, and photoresist compositions using the polymer are disclosed. The photoresist polymers include photoresist monomers containing fluorine-substituted benzylcarboxylate group represented by Formula 1. The photoresist composition has excellent etching resistance, heat resistance and adhesiveness, and is developable in aqueous tetramethylammonium hydroxide (TMAH) solution. As the composition has low light absorbance at 193 nm and 157 nm wavelength, it is suitable for a process using ultraviolet light source such as VUV (157 nm).

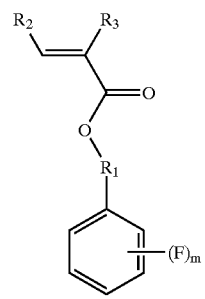

Formula 1

In the Formula, $R_1$, $R_2$, $R_3$ and m are defined in the specification.

19 Claims, 5 Drawing Sheets

PHOTORESIST MONOMERS CONTAINING FLUORINE-SUBSTITUTED BENZYLCARBOXYLATE AND PHOTORESIST POLYMERS COMPRISING THE SAME

BACKGROUND

1. Technical Field

Novel photoresist monomers, polymers thereof and photoresist compositions containing the same are disclosed. In particular, photoresist polymers suitable for a photolithography process using DUV (deep ultraviolet) light source such as VUV (157 nm) in fabricating a minute circuit for a highly integrated semiconductor device, photoresist compositions containing the same, and preparation process therefor are disclosed.

2. Description of the Related Art

A photoresist for an ArF and VUV (vacuum ultraviolet) should have low absorbency at 193 nm and 157 nm wavelengths, excellent etching resistance and adhesiveness on a substrate, and should be easily developable in a commercially available developing solution, such as aqueous tetramethylammonium hydroxide (TMAH) solution of 2.38 wt % or 2.6 wt %.

Much research has been conducted on resins having a high transparency at 248 nm and 193 nm wavelengths, and etching resistance similar to Novolac resins. However, most of the studied resists are not suitable for VUV due to their high absorbency at 157 nm wavelength. Other research on photoresists containing fluorine and silicon has been conducted to solve the above problem. However, most polyethylene or polyacrylate polymers containing fluorine have weak etching resistance, low solubility in an aqueous TMAH solutions and poor adhesiveness to the silicon wafer. In addition, these photoresists are difficult to mass-produce and are expensive.

SUMMARY OF THE DISCLOSURE

Photoresist monomers containing a benzylcarboxylate substituted with fluorine are disclosed.

Photoresist polymers containing the above photoresist monomers are also disclosed.

Photoresist compositions containing the photoresist polymers described above and processes for forming a photoresist pattern are also disclosed.

Semiconductor elements produced using the photoresist compositions described above are also disclosed.

DETAILED DESCRIPTION OF THE PRESENTLY PREFERRED EMBODIMENTS

Photoresist monomers containing benzylcarboxylate substituted with fluorine having high etching resistance are represented by the following Formula 1;

Formula 1.

wherein, $R_1$ is substituted or unsubstituted linear or branched ($C_1$–$C_{10}$) alkylene, or substituted or unsubstituted linear or branched ($C_1$–$C_{10}$) alkylene containing an ether group (—O—); $R_2$ and $R_3$ individually represent H, $CF_3$ or $CH_3$; and m is an integer of 1 to 5.

One preferable example of the monomer represented by Formula 1 is 2,6-difluoro-1-methylbenzylacrylate.

A photoresist copolymer comprises the monomer represented by Formula 1.

The polymer may further comprise at least one monomer represented by the following Formulas 2 and 3.

Formula 2 wherein, $X_1$ and $X_2$ individually represent H or halogen; Y is O, N—R or N—O—R; and R is H, ($C_1$–$C_{10}$) alkyl or an alkyl group partially substituted with halogen.

Formula 3 wherein, $R_4$ is ($C_1$–$C_{20}$) alkyl, perfluoroalkyl or an alkyl partially substituted with fluorine; and n is 0 or 1.

Preferable example of the photoresist polymer includes the repeating unit of the following Formula 4.

Formula 4 wherein, wherein, $R_1$ is substituted or unsubstituted linear or branched ($C_1$–$C_{10}$) alkylene, or substituted or unsubstituted linear or branched ($C_1$–$C_{10}$) alkylene containing ether group (—O—); $R_2$ and $R_3$ individually represent H, $CF_3$ or $CH_3$; $R_4$ is ($C_1$–$C_{20}$) alkyl, perfluoroalkyl or alkyl partially substituted with fluorine; $X_1$ and $X_2$ individually represent H or halogen; Y is O, N—R or N—O—R; R is H, ($C_1$–$C_{10}$) alkyl or an alkyl group substituted with halogen group; m is an integer ranging from of 1 to 5; n is 0 or 1; and the ratio a:b:c is 10–100 mol % : 0–45 mol % : 0–45 mol %.

In the above Formula 5, wherein and $R_4$ individually play a role as acid labile protecting group, which has a function of inhibiting dissolution.

The acid labile protecting group is the one that can be released by acid, which prevent the compound from dissolving in an alkaline developing solution. Some of conventional acid labile protecting group is bounded to polymer, the dissolution of photoresist material by alkaline developing solution is inhibited, while, in case that the acid labile protecting group is released by acid generated by light exposure, the photoresist material can be dissolved in developing solution. As the acid labile protecting group, any groups that can serve such a role may be used; the groups include what are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000).

Preferable examples of the repeating unit of Formula 4 include:

poly(maleic anhydride/hexafluorobutyl-5-norbornene-2-carboxylate/2,6-difluoro-1-methylbenzylacrylate);

poly(N-methylmaleimide/hexafluorobutyl-5-norbornene-2-carboxylate/2,6-difluoro-1-methylbenzylacrylate);

poly(N-t-butoxymaleimide/hexafluorobutyl-5-norbornene-2-carboxylate/2,6-difluoro-1-methylbenzylacrylate); and poly(2,6-difluoro-1-methylbenzylacrylate).

The Polymer of the present invention can be prepared by additional polymerization of the comonomers.

In one particularly preferred method, the polymers are prepared by a process comprising:

(a) admixing (i) a compound of Formula 1 and (ii) at least one of the compounds of Formula 2 and Formula 3; and (b) adding a polymerization initiator into the mixture to obtain a repeating unit of described above Formula 4.

The above polymerization may be performed by bulk or solution polymerization.

When solution polymerization is performed, the step (a) is preferably carried out in conventional organic solvent, such as tetrahydrofuran, cyclohexanone, cyclopentanone, dimethylformamide, dimethylsulfoxide, dioxane, benzene, toluene, xylene, propylene glycol methyl ether acetate and mixtures thereof.

In addition, the polymerization initiators of the step (b) can be any conventional one, for example, 2,2'-azobisisobutyronitrile(AIBN), benzoylperoxide, acetylperoxide, laurylperoxide, tert-butylhydroperoxide, tert-butylperoxide or di-tert-butylperoxide.

Preferably, polymerization of the step (b) is carried out under an inert gas.

After polymerization, the polymers are subject to crystallization and/or purification by using diethyl ether, petroleum ether, hexane, alcohols (methanol, ethanol, isopropanol and the like), water and mixtures thereof.

Photoresist composition comprise: i) a photoresist polymer described above; (ii) a photoacid generator; and (iii) an organic solvent.

Any of known photoacid generators, which is able to generate acids by light, can be used in photoresist composition of present invention. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000).

Preferred photoacid generators have relatively low absorbance in the wavelength of 157 nm and 193 nm. More preferred photoacid generator include sulfide or onium type compound. Specifically, photoacid generators are selected from the group consisting of phthalimidotrifluoromethane sulfonate, dinitrobenzyltosylate, n-decyl disulfone and naphthylimido trifluoromethane sulfonate.

The photoacid generator can further comprise a compound selected from the group consisting of diphenyliodide hexafluorophosphate, diphenyliodide hexafluoroarsenate, diphenyliodide hexafluoroantimonate, diphenyl-p-methoxyphenylsulfonium triflate, diphenyl-p-toluenylsulfonium triflate, diphenyl-p-isobutylphenylsulfonium triflate, triphenylsulfonium hexafluoroarsenate, triphenylsulfonium hexafluoroantimonate, triphenylsulfonium triflate and dibutylnaphthylsulfonium triflate.

The photoacid generator is used in an amount ranging from about 0.05 to about 10 wt % of the photoresist polymer employed.

It has been found that when the photoacid generator is used in the amount less than 0.05 wt %, it lowers photosensitivity of the photoresist composition, and when the photoacid generator is used in the amount of greater than about 10 wt %, it results in poor pattern formation due to its high absorption of DUV.

Organic solvent can be any of known solvent disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000).

Preferable organic solvents include methyl 3-methoxy propionate, ethyl 3-ethoxypropionate, propyleneglycol methyl ether acetate, cyclohexanone, 2-heptanone, ethyl lactate, diethyleneglycol diethyl ether or mixture thereof.

The amount of organic solvent ranges from about 500 to about 2000 wt % of the photoresist polymer to coat the photoresist in a wanted thickness. It has been found that when the amount of organic solvent is about 1000 wt % of the photoresist polymer, a photoresist layer having about 0.25 μm of thickness can be obtained.

Figure 1:
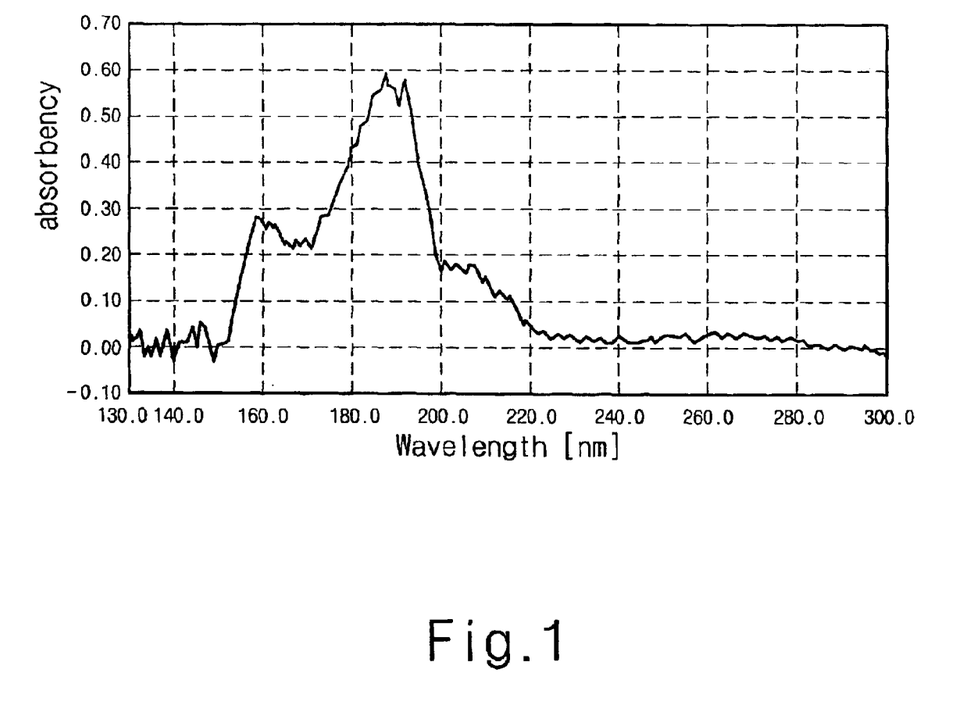
FIG. 1 is a VUV spectrum for the photoresist composition of the present invention.

The photoresist compositions containing repeating units have low absorbency and excellent etching resistance at 157 nm wavelength. The absorbency of the photoresist compositions when coated with 2500 Å thickness is 0.25 at 157 nm wavelength, which is about one-half of the absorbency of the general photoresist (see FIG. 1).

The former photoresist can been patterned at 157 nm wavelength, when coated with below a range of 600–700 Å thickness. But the photoresist compositions of the present invention can be patterned when coated with over 1200 Å thickness.

The photoresist compositions are obtained the photoresist pattern having excellent etching resistance and profile.

A process for forming photoresist patterns comprises:
(a) coating the photoresist composition described above on a substrate to form a photoresist film;
(b) exposing the photoresist film to light; and
(c) developing the photoresist film to obtain a photoresist pattern.

The process for forming the photoresist pattern can further include a soft baking step which is performed before the step (b) and/or a post baking step which is performed after the step (b). Preferably, the soft and post baking steps are performed at the temperature ranging from about 70 to about 200° C.

Exemplary light sources which are useful for forming the photoresist pattern include KrF, ArF, E-beam, VUV, EUV, x-ray or ion beam. Preferably, the irradiation energy is in the step (b) is in the range between about 1 mJ/cm² and about 100 mJ/cm².

I. Preparation of Photoresist Polymers

EXAMPLE 1

Synthesis of Poly(maleic anhydride/hexafluorobutyl-5-norbornene-2-carboxylate/2,6-difluoro-1-methylbenzylacrylate)

To 20 mL of tetrahydrofuran was added 10 mmole of maleic anhydride, 10 mmole of hexafluorobutyl-5-norbornene-2-carboxylate, 80 mmole of 2,6-difluoro-1-methylbenzylacrylate and 0.3 g of AIBN, and the resulting solution was reacted at about 65° C. for about 10 hours.

Thereafter, a polymer was precipitated in petroleum ether solution and filtered, thereby obtaining the polymer (yield:67%).

EXAMPLE 2

Synthesis of Poly(N-methylmaleimide/hexafluorobutyl-5-norbornene-2-carboxylate/2,6-difluoro-1-methylbenzylacrylate)

To 20 mL of tetrahydrofuran was added 10 mmole of N-methylmaleimide, 10 mmole of hexafluorobutyl-5-norbornene-2-carboxylate, 80 mmole of 2,6-difluoro-1-methylbenzylacrylate and 0.3 9 of AIBN, and the resulting solution was reacted at about 65° C. for about 12 hours.

Thereafter, a polymer was precipitated in petroleum ether solution and filtered, thereby obtaining the polymer (yield:71%).

EXAMPLE 3

Synthesis of Poly(N-t-butoxymaleimide/hexafluorobutyl-5-norbornene-2-carboxylate/2,6-difluoro-1-methylbenzylacrylate)

To 20 mL of tetrahydrofuran was added 50 mmole of N-t-butoxymaleimide, 10 mmole of hexafluorobutyl-5-norbornene-2-carboxylate, 80 mmole of 2,6-difluoro-1-methylbenzylacrylate and 0.3 g of AIBN, and the resulting solution was reacted at about 65° C. for about 12 hours.

Thereafter, a polymer was precipitated in water/methanol solution, filtered and dried in vacuo to obtain title compound (yield:71%).

EXAMPLE 4

Synthesis of Poly(2,6-difluoro-1-methylbenzylacrylate)

To 20 mL of tetrahydrofuran was added 100 mmole of 2,6-difluoro-1-methylbenzylacrylate and 0.32 g of AIBN, and the resulting solution was reacted at about 65° C. for about 12 hours.

Thereafter, a polymer was precipitated in water/methanol solution, filtered and dried in vacuo to obtain title compound (yield:74%).

II. Preparation of Photoresist Composition and Formation of Patterns

EXAMPLE 5

To 20 g of propylene glycol methyl ether acetate (PGMEA) was added 2 g of the polymer of Example 1, 0.024 g of phthalimidotrifluoromethane sulfonate, and 0.06 g of triphenylsulfonium triflate. The resulting solution was filtered through 0.20 μm filter to obtain a photoresist composition.

Figure 2:
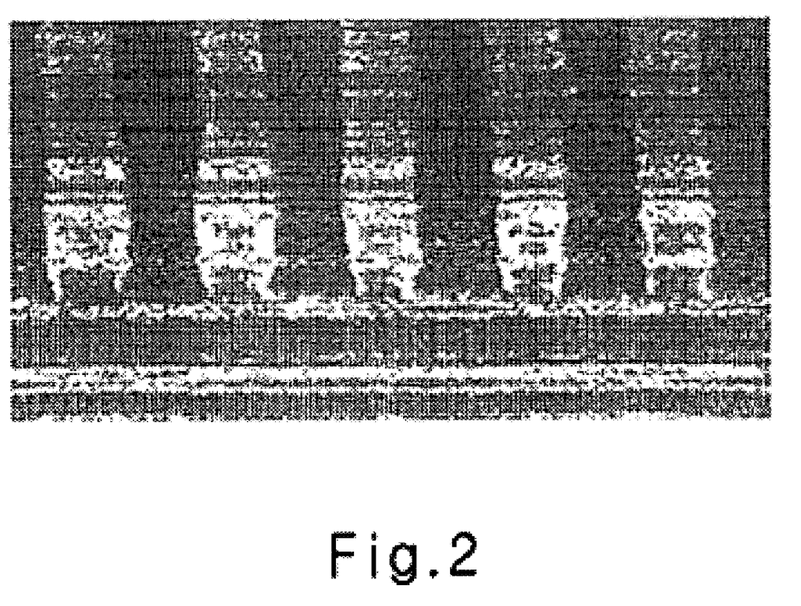
FIG. 2 is a photograph showing a pattern obtained in Example 5.

The photoresist composition thus prepared was spin-coated on silicon wafer to form a photoresist film, and soft-baked in an oven or hot plate of about 130° C. for about 90 seconds. After baking, the photoresist was exposed to light using a KrF laser exposer, and then post-baked at about 130° C. for about 90 seconds. When the post-baking was completed, it was developed in 2.38 wt % aqueous TMAH solution for about 40 seconds, to obtain 0.12 μm L/S pattern (see FIG. 2).

EXAMPLE 6

To 20 g of propylene glycol methyl ether acetate (PGMEA) was added 2 g of the polymer of Example 2, 0.024 g of phthalimidotrifluoromethane sulfonate, and 0.06 g of triphenylsulfonium triflate. The resulting solution was filtered through 0.20 μm filter to obtain a photoresist composition.

Figure 3:
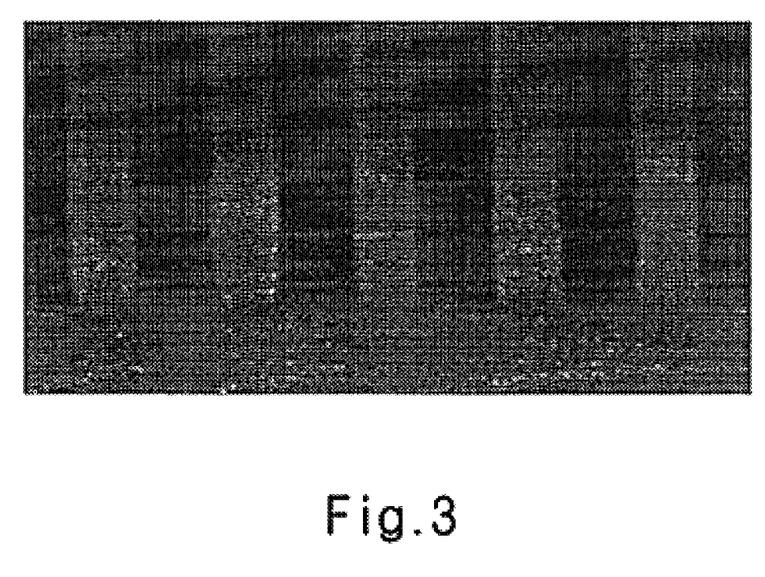
FIG. 3 is a photograph showing a pattern obtained in Example 6.

The photoresist composition thus prepared was spin-coated on silicon wafer to form a photoresist film, and soft-baked in an oven or hot plate of about 130° C. for about 90 seconds. After baking, the photoresist was exposed to light using a KrF laser exposer, and then post-baked at about 130° C. for about 90 seconds. When the post-baking was completed, it was developed in 2.38 wt % aqueous TMAH solution for about 40 seconds, to obtain 0.13 μm L/S pattern (see FIG. 3).

EXAMPLE 7

To 20 g of propylene glycol methyl ether acetate (PGMEA) was added 2 g of the polymer of Example 3, 0.024 g of phthalimidotrifluoromethane sulfonate, and 0.06 g of triphenylsulfonium triflate. The resulting solution was filtered through 0.20 μm filter to obtain a photoresist composition.

Figure 4:
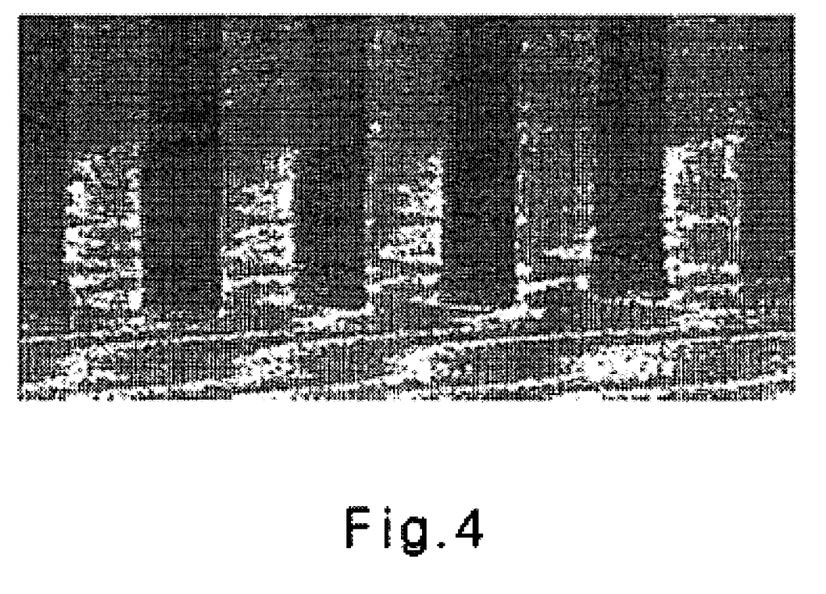
FIG. 4 is a photograph showing a pattern obtained in Example 7.

The photoresist composition thus prepared was spin-coated on silicon wafer to form a photoresist film, and soft-baked in an oven or hot plate of about 130° C. for about 90 seconds. After baking, the photoresist was exposed to light using a KrF laser exposer, and then post-baked at about 130° C. for about 90 seconds. When the post-baking was completed, it was developed in 2.38 wt % aqueous TMAH solution for about 40 seconds, to obtain 0.13 μm L/S pattern (see FIG. 4).

EXAMPLE 8

To 20 g of propylene glycol methyl ether acetate (PGMEA) was added 2 g of the polymer of Example 4, 0.024 g of phthalimidotrifluoromethane sulfonate, and 0.06 g of triphenylsulfonium triflate. The resulting solution was filtered through 0.20 μm filter to obtain a photoresist composition.

Figure 5:
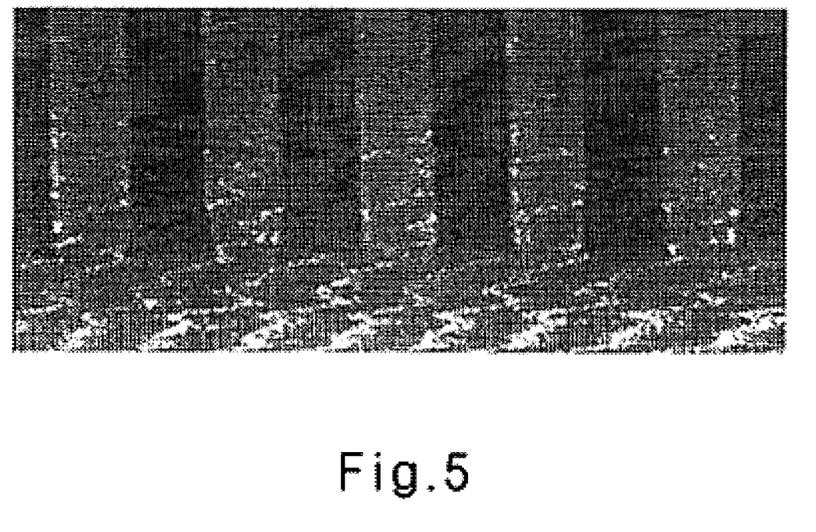
FIG. 5 is a photograph showing a pattern obtained in Example 8.

The photoresist composition thus prepared was spin-coated on silicon wafer to form a photoresist film, and soft-baked in an oven or hot plate of about 130° C. for about 90 seconds. After baking, the photoresist was exposed to light using a KrF laser exposer, and then post-baked at about 130° C. for about 90 seconds. When the post-baking was completed, it was developed in 2.38 wt % aqueous TMAH solution for about 40 seconds, to obtain 0.14 μm L/S pattern (see FIG. 5).

As discussed earlier, the photoresist pattern using the photoresist compositions of the present invention can be formed with excellent durability, etching resistance, reproducibility and resolution.

In addition, the photoresist compositions can be used to form an ultrafine pattern of DRAM over 4 G and 16 G as well as DRAM below 1 G. Moreover, the photoresist polymer comprising fluorine has high light transmittance at a low wavelength of light source, and thus is suitable for VUV.

What is claimed:

1. A photoresist monomer that is 2,6-difluro-1-methylbenzylacrylate.

2. A photoresist polymer comprising a repeating unit represented by the following Formula 1 and at least one monomer selected from the group consisting of following Formulas 2 and 3:

Formula 1

Formula 2

Formula 3 wherein, $R_1$ is $(C_1-C_{10})$ alkylene or a $(C_1-C_{10})$ alkylene containing an ether group (—O—); $R_2$ and $R_3$ are individually selected from the group consisting of H, $CF_3$ and $CH_3$; $X_1$ and $X_2$ are individually represent H or halogen; Y is selected from the group consisting of O, N—R and N—O—R; R is selected from the group consisting of H, $(C_1-C_{10})$ alkyl and an alkyl group substituted with a halogen; $R_4$ is selected from the group consisting of $(C_1-C_{20})$ alkyl, perfluoroalkyl and an alkyl partially substituted with fluorine; m is an integer ranging from 1 to 5 and n is 0 or 1.

3. The photoresist polymer according claim 2, comprising a repeating unit of the following Formula 4:

Formula 4 wherein, $R_1$ is $(C_1-C_{10})$ alkylene or $(C_1-C_{10})$ alkylene containing ether group (—O—); $R_2$ and $R_3$ are individually selected from the group consisting of H, $CF_3$ and $CH_3$; $R^4$ is selected from the group consisting of $(C_1-C_2)$ alkyl, perfluoroalkyl and an alkyl partially substituted with fluorine; $X_1$ and $X_2$ individually represent H or halogen; Y is selected from the group consisting of O, N—R and N—O—R; R is selected from the group consisting of H, $(C_1-C_{10})$ alkyl and an alkyl group substituted with halogen; m is an integer ranging from 1 to 5; n is 0 or 1; and the ratio a:b:c falls within the ranges 10–100 mol % : 0–45 mol % : 0–45 mol %.

4. The photoresist polymer according to claim 3, wherein the repeating unit is selected from the group consisting of:
poly(maleic anhydride/hexafluorobutyl-5-norbornene-2-carboxylate/2,6-difluoro-1-methylbenzylacrylate);
poly(N-methylmaleimide/hexafluorobutyl-5-norbornene-2-carboxylate/2,6-difluoro-1-methylbenzylacrylate);
poly(N-t-butoxymaleimide/hexafluorobutyl-5-norbornene-2-carboxylate/2,6-difluoro-1-methylbenzylacrylate); and
poly(2,6-difluoro-1-methylbenzylacrylate).

5. The photoresist polymer according to claim 2, wherein the compound of Formula 1 is 2,6-difluoro-1-methylbenzylacrylate.

6. A process for preparing a photoresist polymer comprising:
   (a) admixing (i) compound of Formula 1 and (ii) at least one compound selected from the group consisting of Formulas 2 and 3; and
   (b) adding a polymerization initiator into the mixture to obtain repeating unit of Formula 4:

Formula 1

Formula 2

Formula 3 and

Formula 4 wherein, $R_1$ is $(C_1-C_{10})$ alkylene or $(C_1-C_{10})$ alkylene containing an ether group (—O—); $R_2$ and $R_3$ are individually selected from the group consisting of H, $CF_3$ and $CH_3$; $R_4$ is selected from the group consisting of $(C_1-C_{20})$ alkyl, perfluoroalkyl and alkyl partially substituted with fluorine; $X_1$ and $X_2$ are individually H or halogen; Y is selected from the group consisting of O, N—R and N—O—R; R is selected from the group consisting of H, $(C_1-C_{10})$ alkyl and an alkyl group substituted with halogen; m is an integer ranging from 1 to 5; n is 0 or 1; and the ratio a:b:c falls within the ranges 10–100 mol % : 0–45 mol % : 0–45 mol %.

7. A process for preparing a photoresist polymer according to claim 6, wherein the step (a) is carried out in a polymerization solvent selected from the group consisting of tetrahydrofuran, cyclohexanone, cyclopentanone, dimethylformamide, dimethylsulfoxide, dioxane, benzene, toluene, xylene, propylene glycol methyl ether acetate and mixtures thereof.

8. A process for preparing a photoresist polymer according to claim 6, wherein the polymerization initiator is selected from the group consisting of 2,2'-azobisisobutyronitrile (AIBN), benzoylperoxide, acetylperoxide, laurylperoxide, tert-butylhydroperoxide, tert-butylperoxide and di-tert-butylperoxide.

9. A photoresist composition comprising:
   (i) the photoresist polymer of claim 2,
   (ii) an organic solvent; and
   (iii) a photoacid generator.

10. The photoresist composition according to claim 9, wherein the photoacid generator is selected from the group consisting of phthalimidotrifluoromethane sulfonate, dinitrobenzyl tosylate, n-decyl disulfone and naphthyl imidotrifluoro methanesulfonate.

11. The photoresist composition according to claim 10, wherein the photoacid generator further comprises one or more compound(s) selected from the group consisting of diphenyl iodide hexafluorophosphate, diphenyliodide hexafluoroarsenate, diphenyliodide hexafluoroantimonate, diphenyl-p-methoxyphenylsulfonium triflate, diphenyl-p-toluenylsulfonium triflate, diphenyl-p-isobutylphenylsulfonium triflate, triphenylsulfonium hexafluoroarsenate, triphenylsulfonium hexafluoroantimonate, triphenylsulfonium triflate and dibutylnaphthylsulfonium triflate.

12. The photoresist composition according to claim 9, wherein the photoacid generator is used in an amount ranging from about 0.05 to about 10 % by weight of the photoresist polymer.

13. The photoresist composition according to claim 9, wherein the organic solvent is selected from the group consisting of diethyleneglycol diethyl ether, ethyl 3-ethoxypropionate, methyl 3-methoxypropionate, cyclohexanone, propyleneglycol methyl ether acetate, n-heptanone, ethyl lactate, cyclopentanone and mixtures thereof.

14. The photoresist composition according to claim 9, herein the organic solvent is used in an amount ranging from about 500 to about 2000% by weight of said photoresist polymer.

15. A process for forming a photoresist pattern comprising:
   (a) coating the photoresist composition of claim 9 on a substrate to form a photoresist film;
   (b) exposing the photoresist film to a light; and
   (c) developing the photoresist film to obtain a photoresist pattern.

16. The process according to claim 15, further comprising a soft baking step before step (b) and/or a post baking step after step (b).

17. The process according to claim 16, wherein the soft and post baking steps are performed at the temperature ranging from about 70 to about 200° C.

18. The process according to claim 15, wherein the light source is selected from the group consisting of KrF, ArF, E-beam, VUV, EUV, x-ray and ion beam.

19. A semiconductor element manufactured according to the process of claim 15.

* * * * *

UNITED STATES PATENT AND TRADEMARK OFFICE
CERTIFICATE OF CORRECTION

PATENT NO. : 6,737,217 B2
DATED : May 18, 2004
INVENTOR(S) : Geun-Su Lee et al.

It is certified that error appears in the above-identified patent and that said Letters Patent is hereby corrected as shown below:

Title page,
Item [75], Inventors, please delete "Ichon" and replace with -- Kyoungki-do --.

Column 7,
Line 48, please delete "difluro" and replace with -- difluoro --.

Column 8,
Line 27, please delete "according claim 2," and replace with -- according to claim 2, --.

Column 10,
Line 42, please delete "herein" and replace with -- wherein --.

Signed and Sealed this

Sixteenth Day of November, 2004

JON W. DUDAS
*Director of the United States Patent and Trademark Office*